(12) United States Patent
Kawahara et al.

(10) Patent No.: US 9,029,839 B2
(45) Date of Patent: May 12, 2015

(54) SEMICONDUCTOR DEVICE, METHOD OF MANUFACTURING THE SEMICONDUCTOR DEVICE, AND A THIN FILM

(71) Applicant: Renesas Electronics Corporation, Kanagawa (JP)

(72) Inventors: Jun Kawahara, Kanagawa (JP); Yoshihiro Hayashi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 210 days.

(21) Appl. No.: 13/659,461

(22) Filed: Oct. 24, 2012

(65) Prior Publication Data

US 2013/0105772 A1 May 2, 2013

(30) Foreign Application Priority Data

Nov. 2, 2011 (JP) ................. 2011-240858

(51) Int. Cl.
*H01L 29/08* (2006.01)
*H01L 51/00* (2006.01)
*C08G 77/60* (2006.01)
*C08G 77/62* (2006.01)
*H01L 51/05* (2006.01)

(52) U.S. Cl.
CPC .......... *H01L 51/0094* (2013.01); *H01L 51/004* (2013.01); *H01L 51/0079* (2013.01); *H01L 51/0541* (2013.01); *H01L 51/0545* (2013.01); *C08G 77/60* (2013.01); *C08G 77/62* (2013.01)

(58) Field of Classification Search
CPC .................................................. H01L 51/0094
USPC ............................................. 257/40; 438/82
See application file for complete search history.

(56) References Cited

U.S. PATENT DOCUMENTS

| 7,365,230 B2 | 4/2008 | Herron et al. |
| 2005/0184287 A1 | 8/2005 | Herron et al. |
| 2008/0132622 A1 | 6/2008 | Herron et al. |

FOREIGN PATENT DOCUMENTS

| JP | 2-294333 | 12/1990 |
| JP | 6-256523 | 9/1994 |
| JP | 2003-165841 | 6/2003 |
| JP | 2007-527420 | 9/2007 |

*Primary Examiner* — Douglas Menz
(74) *Attorney, Agent, or Firm* — Young & Thompson (57) ABSTRACT

A semiconductor device containing a novel cyclosiloxane polymer showing electroconductivity or semiconductivity has a charge transport layer comprising a plasma polymer containing structural units (A) each having a transition metal as a central metal and structural units (B) each situated between structural units (A) adjacent to each other and having a cyclosiloxane skeleton. The charge transport layer is formed by plasma polymerization of an organic metal compound having the transition metal as the central metal and the cyclosiloxane compound in a reactor.

19 Claims, 4 Drawing Sheets

SEMICONDUCTOR DEVICE, METHOD OF MANUFACTURING THE SEMICONDUCTOR DEVICE, AND A THIN FILM

CROSS-REFERENCE TO RELATED APPLICATIONS

The disclosure of Japanese Patent Application No. 2011-240858 filed on Nov. 2, 2011 including the specification, drawings, and abstract is incorporated herein by reference in its entirety.

BACKGROUND

The present invention concerns a semiconductor device, a method of manufacturing the semiconductor device, and a thin film.

Various polysiloxane compounds have been proposed for various application uses as shown in the following prior patent literatures as described below.

Japanese Unexamined Patent Application Publication (Translation of PCT Application) No. 2007-527420 discloses a compound having a crosslinking group as a material for a functional layer of an organic light emitting diode or the like. The publication describes that the crosslinking group may be a siloxane. It is described that crosslinking can be induced in the compound by incorporating such a crosslinking group in the compound.

Further, Japanese Unexamined Patent Application Publication No. 2003-165841 describes an organometallosiloxane having a metaloxysilyl group in which an alkoxy group is bonded to a titanium atom, zirconium atom, or aluminum atom at the end of a molecular chain, and a production process therefor. The literature describes that the polyorganometallosiloxane has an excellent surface treatment effect for an inorganic powder.

Further, Japanese Unexamined Patent Application Publication No. Hei 06 (1994)-256523 describes a crosslinked polysiloxane containing one of transition metals selected from titanium, chromium, manganese, iron, and palladium in a molecule. It is described that the polysiloxane type polymeric material containing such transition metal has a non-linear optical characteristic and heat resistance together.

Further, Japanese Unexamined Patent Application Publication No. Hei 02 (1990)-294333 describes the following crosslinked polysiloxane. In the crosslinked polysiloxane, a linear polysiloxane having carboxy alkyl groups on both ends in the molecule is crosslinked. The ends of the linear polysiloxane are crosslinked by an aluminum atom or a titanium atom. It is described that the crosslinked polysiloxane can form an air permeable coating membrane that does not deteriorate physiological safety.

SUMMARY

The present inventors, et al have found that when a polymerized film containing a transition metal and a siloxane is formed under a certain condition, the polymerized film exhibits electroconductivity or semiconductivity.

The present invention provides a semiconductor device having a charge transport layer comprising a plasma polymer containing structural units (A) each having a transition metal as a central metal and structural units (B) each situated between the structural units (A) adjacent to each other and having a cyclosiloxane skeleton.

The present invention provides a method of manufacturing a semiconductor device including a polymerization step of forming a charge transport layer by plasma polymerization of an organic metal compound having a transition metal as a central metal and a cyclosiloxane compound in a reactor.

The present invention also provides a thin film comprising a plasma polymer containing structural units (A) each having a transition metal as a central metal and structural units (B) each situated between the structural units (A) adjacent to each other and having a cyclosiloxane skeleton.

According to the invention, the charge transport layer comprises the plasma polymer containing the structural units each (A) having the transition metal as the central metal and the structural units (B) each having the cyclosiloxane skeleton. Thus, in the charge transporting layer, the structural unit (A) having the transition metal functions as a doner or a hopping site. Accordingly, a semiconductor device having a novel cyclosiloxane polymer showing electroconductivity or semiconductivity can be provided.

The present invention can provide a semiconductor device having a novel cyclosiloxane polymer showing electroconductivity or semiconductivity.

DETAILED DESCRIPTION

Preferred embodiments of the invention are to be described with reference to the drawings. Throughout the drawings, similar constituent elements carry identical reference numerals for which description is to be omitted optionally.

First Embodiment

Figure 1:
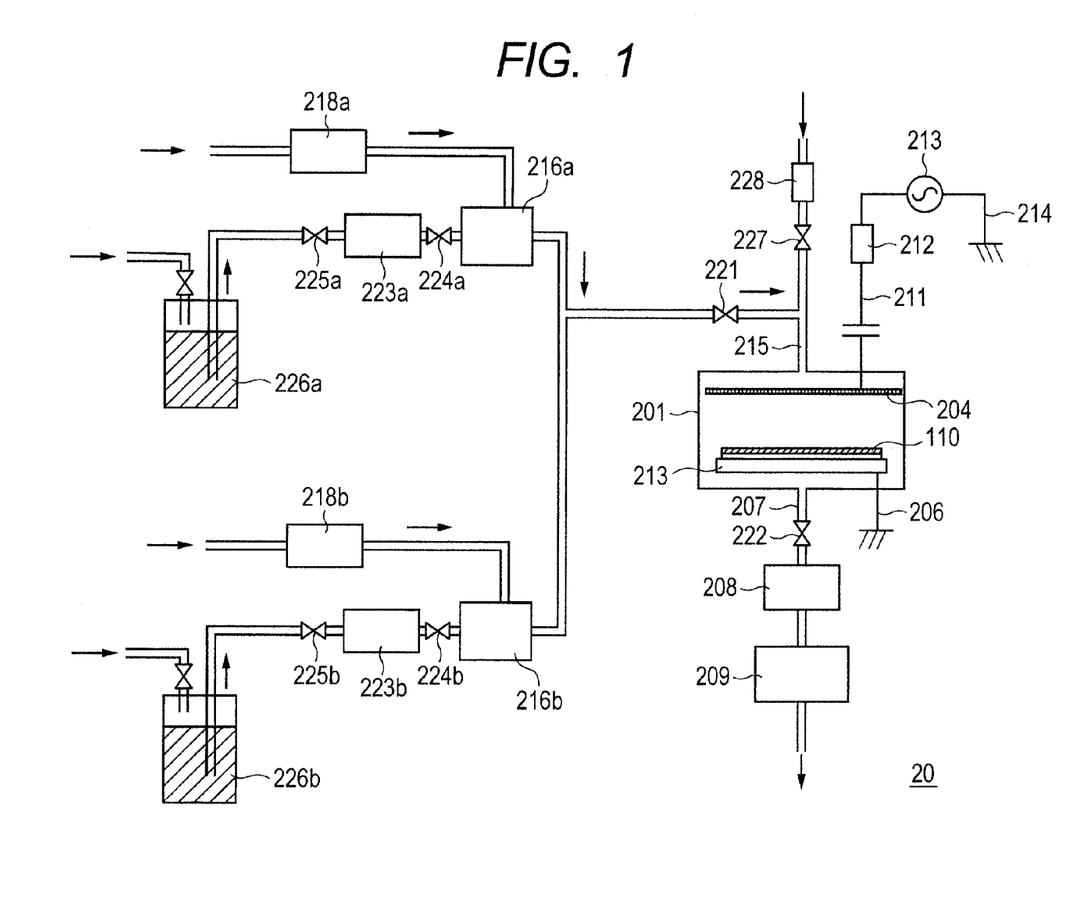
FIG. 1 is a schematic view showing a configuration of an apparatus for manufacturing a semiconductor device according to a first embodiment.

With reference to FIG. 1, a manufacturing apparatus 20 of a semiconductor device 10 according to a first embodiment is to be described. FIG. 1 is a schematic view showing a configuration of a manufacturing apparatus 20 of a semiconductor device 10 according to the first embodiment.

According to the first embodiment, a charge transport layer (140) comprises a plasma polymer containing a structural unit (A) having a transition metal as a central metal and a structural unit (B) having a cyclosiloxane skeleton. A manufacturing apparatus 20 for forming the plasma polymer as described above includes, for example, the following configuration. The manufacturing apparatus 20 is, for example, a parallel plate type plasma CVD (Chemical Vapor Deposition) apparatus.

As shown in FIG. 1, a reactor 201 has an exhaust system as described below. The reactor 201 is connected, for example, by way of an exhaust pipeline 207, an exhaust valve 222, and a cooling trap 208 to a vacuum pump 209. Inside of the reactor 201 can be depressurized by operating the vacuum pump 209.

Further, a throttle valve (not illustrated) is interposed between the reactor 201 and the vacuum pump 209. By adjusting the opening degree of the throttle valve, the pressure inside the reaction 201 can be controlled.

Then, the configuration of supplying the starting gas is to be described. As the starting materials used in the first embodiment, two types of starting materials, i.e., an organic metal compound having a transition metal as a central metal and a cyclosiloxane compound to be described later are used. Each of the starting materials is liquid.

The starting material for the organic metal compound is sealed in a starting material reservoir tank 226a. The starting material for the organic metal compound is pumped from a starting material reservoir tank 226a being carried on an inert gas. The inert gas includes, for example, He, Ar, Xe, and $N_2$.

The pumped starting material for the organic metal compound is further introduced by way of a valve 225a, a liquid flow rate controller 223a, and a valve 224a successively to an evaporator 216a. The flow rate of the material introduced to the evaporator 216a is adjusted by a liquid flow rate controller 223a. Further, the starting material introduced to the evaporator 216a is evaporated in the evaporator 216a into an evaporated gas. The evaporated gas is supplied by way of a valve 221 and a pipeline 215 into the reactor 201.

A carrier gas is introduced by way of a gas flow rate controller 218a into the evaporator 216a. As the carrier gas, an inert gas is used. Specifically, the carrier gas includes, for example, He, Ar, Xe, and $N_2$. The flow rate of the carrier gas is adjusted to a desired flow rate by a gas flow rate controller 218a.

In the same manner as the organic metal compound, a starting material for the cyclosiloxane compound is sealed in a starting material reservoir tank 226b. The starting material for the cyclosiloxane compound is pumped being carried on an inert gas from the reservoir tank 226b. The pumped starting material for the cyclosiloxane compound is further introduced by way of a valve 225b, a liquid flow rate controller 223b, and a valve 224b successively into an evaporator 216b. Further, a carrier gas is introduced into the evaporator 216b by way of a gas flow rate controller 218b.

In each of the evaporator 216a and the evaporator 216b, the gas flow rate and the evaporation temperature are controlled such that each of the starting material gases, when evaporated, is at a pressure lower than the saturation vapor pressure for each of them. Thus, even when the saturation vapor pressure is different between the organic metal compound and the cyclosiloxane compound, an evaporated gas can be obtained stably.

Further, the starting gases evaporated by the evaporator 216a and the evaporator 216b are transported by way of the valve 221 and the pipeline 215 to the reactor 201. In this process, pipelines extending from the evaporators 216a and the evaporator 216b to the reactor 201 are heated by a heater (not illustrated). This suppresses re-liquefication of each of the starting materials. The heating temperature of the pipeline is adjusted, for example, to 40° C. or higher and 180° C. or lower. As described above, the starting materials for the organic metal compound and the cyclosiloxane compound are mixed just before introduction into the reactor 201.

Further, a pipeline for introducing an additive gas by way of an additive gas flow rate controller 228 and a valve 227 may be connected to the reactor 201. As the additive gas, an oxidative gas can be used. Specifically, the additive gas is, for example, $O_2$, $CO_2$, CO, $N_2O$, and $NO_2$.

Then, the configuration inside the reactor 201 is to be described. A state 203 having a heating function is disposed inside the reactor 201. In the manufacturing step, an insulative substrate 110 to be described later is placed on the stage 203.

A shower head 204 having a plurality of penetration holes is disposed above the stage 203. The starting material gas and the carried gas introduced into the reactor 201 are dispersed by the shower head 204. A gas dispersion plate (not illustrated) may be disposed further above the shower head 204.

A high frequency power source 213 is connected to the shower head 204 by way of a power feeder line 211 and a matching controller 212. The high frequency power source 213 is, for example, an RF (Radio Frequency) power source. On the other hand, a grounding line 206 is connected to the stage 203. By applying a high frequency wave between the shower head 204 and the stage 203, the starting material gas and the carrier gas can be excited into a plasma state.

The configuration inside the reactor 201 is not restricted to a so-called anode coupling type in which the high frequency power source 213 is disposed on the side of the shower head 204 as described above. In addition, the reactor 201 may be of a so-called cathode coupling type in which the high frequency power source 213 is disposed on the side of the stage 203. Further, inside of the reactor 201 may be configured such that two frequencies can be superposed in which a high frequency power sources are provided to an anode and a cathode respectively so as to apply different high frequencies to them.

The frequency of the applied high frequency wave is, for example, 1 MHz or higher. Specifically, the frequency may be 13.56 MHz, or harmonic frequency thereof. In addition to the high frequency power source 213, a low frequency power source generating power at lower than 1 MHz (not illustrated) may also be provided. The low frequency power source may be connected to the shower head 204 or to the stage 203 in the same manner as the high frequency power source 213.

In addition, a pipeline for supplying a cleaning gas (not illustrated) is connected to the reactor 201. The cleaning gas includes, for example, $NF_3$, $SF_6$, $CF_4$, and $C_2F_6$. The gases may optionally be a gas mixed with a gas such as $O_2$ or $O_3$. In the cleaning, cleaning is performed while generating a plasma by applying a high frequency between the shower head 204 and the stage 203 in the same manner as in the polymerization step. The method is not restrictive but a method of using a cleaning gas previously formed into a plasma state may also be used by using a remote plasma, etc.

Description has been made to the parallel plate type plasma CVD apparatus, but this is not restrictive. As to be described later, it may suffice that at least the cyclosiloxane compound is converted into a plasma state. Accordingly, the manufacturing apparatus 20 may be configured such that only the cyclosiloxane compound passes through the plasma. Alternatively, the manufacturing apparatus 20 may be configured to use a remote plasma generator and excite the cyclosiloxane compound into a plasma state at a place different from that in the reactor 201, and supply the same to the reactor 201.

(Starting Material)

Then, the starting material used in the first embodiment is to be described. At first, the starting material for the cyclosiloxane compound is to be described.

The cyclosiloxane compound has a cyclic molecular skeleton having a siloxane bond (Si—O). The cyclosiloxane compound has, for example, a structure of the following chemical formula (1).

(1)

In the chemical formula (1), n is from 2 to 5. Each of $R_x$ and $R_y$ represents hydrogen, an unsaturated hydrocarbon group, or a saturated hydrocarbon group. Each of the unsaturated hydrocarbon group and the saturated hydrocarbon group is a vinyl group, allyl group, methyl group, ethyl group, propyl group, isopropyl group, butyl group, or tertiary butyl group.

In the cyclosiloxane compound described above, n is preferably 3 or 4. When n is 3 or 4, the cyclosiloxane compound can be deposited by evaporation and transportation of the compound. On the other hand, if n is 5 or more, the molecular weight of the cyclosiloxane compound is large. Therefore, it is extremely difficult to evaporate and transport the cyclosiloxane compound. Further, the siloxane skeleton of the cyclosiloxane compound is stable in view of energy compared with that of the side chain. Thus, a plasma polymer can be formed while leaving the cyclosiloxane skeleton as it is in the cyclosiloxane compound.

The cyclosiloxane compound preferably has an ethylene group on the side chain $R_x$ or $R_y$ in the chemical formula (1). Thus, the ethylene group of the cyclosiloxane compound can be radicalized to polymerize the cyclosiloxane compound with the organic metal compound to be described later.

The cyclosiloxane compound represented by the chemical formula (1) has a structure of a tetravinyl cyclotetrasiloxane derivative represented by the following chemical formula (5), or a trivinyl cyclotrisiloxane derivative represented by the following chemical formula (6).

(5)

(6)

In the chemical formula (5) or (6), each of R1, R2, R3, and R4 is hydrogen, an unsaturated hydrocarbon group, or a saturated hydrocarbon group. Each of the unsaturated hydrocarbon group and the saturated hydrocarbon group is a vinyl group, allyl group, methyl group, ethyl group, propyl group, isopropyl group, or butyl group.

Specifically, the tetravinyl cyclotetrasiloxane derivative represented by the chemical formula (5) includes, for example, tetravinyl tetramethyl cyclotetrasiloxane represented by the following chemical formula (7), and tetravinyl tetrapropyl cyclotetrasiloxane represented by the following chemical formula (8). Further, the trivinyl cyclotrisiloxane derivative represented by the chemical formula (6) includes, for example, a trivinyl triisopropyl cyclotrisiloxane represented by the following chemical formula (9).

(7)

(8)

(9)

Then, the starting material for the organic metal compound is to be described. In the first embodiment, a organic metal compound having a transition metal as a central metal contains, for example, a methyl amino group, an ethyl amino group, etc. as an organic amino group.

Specifically, the organic metal compound has one of the structure represented by the following chemical formula (2), (3), or (4).

(2)

(3)

-continued (4)

In the chemical formula (2), (3), or (4), M represents a transition metal. Specifically, the transition metal M is Ti, Hf, or Zr. M may also be Sn as other metal which is not the transition metal.

(Manufacturing Method)

Then, the manufacturing method of a semiconductor device 10 according to the first embodiment is to be described. In the manufacturing method of the semiconductor device 10 according to the first embodiment, an organic metal compound having a transition metal for the central metal and a cyclosiloxane compound are subjected to plasma polymerization in the reactor 201 to form a charge transport layer (140) (polymerization step). This is to be described specifically.

At first, the insulative substrate 110 is placed on the stage 203 in the reactor 201. A gate electrode 120 or the like may also be formed previously to the insulative substrate 110.

Then, a heater of the stage 203 is heated to control the surface temperature of the insulative substrate 110 to 100° C. or higher and 400° C. or lower. Further, the surface temperature of the insulative substrate 110 is preferably controlled to 250° C. or higher and 350° C. or lower. Then, inside of the reactor 210 is evacuated by using the vacuum pump 209.

Then, a carrier gas and each of starting material gases are supplied to the reactor 201 and the throttle valve is adjusted. Thus, the pressure in the reactor 201 is controlled to 1 Torr or higher and 6 Torr or lower. In this process, the partial pressure for each of the starting material gases is preferably adjusted to 0.1 Torr or higher and 3 Torr or lower. The carrier gas may also be supplied to the reactor 201 prior to the supply of the starting material gases depending on the starting materials to be used.

Then, a high frequency wave is applied by the high frequency power source 213 between the shower head 204 and the stage 203. Thus, the plasma is generated. The applied high frequency power is preferably from 25 W or 300 W and, for example, 100 W.

By controlling the conditions as described above, each of the starting materials is excited by the plasma. The excited cyclosiloxane compound in an activated state causes a polymerizing reaction with the organic metal compound. Thus, a thin film comprising a plasma polymer is formed on the insulative substrate 110. The step is referred to as "polymerization step".

In the polymerization step, at least the cyclosiloxane compound is put to a plasma state thereby polymerized with the organic metal compound. The one of the side chains of the cyclosiloxane excited into the plasma state and the ligand of the organic metal compound are bonded.

When the cyclosiloxane compound has, for example, an ethylene group on the side chain, the ethylene group of the cyclosiloxane is radicalized and polymerized with the organic metal compound. Thus, the double bond of the ethylene group is bonded to one of the ligands of the organic metal compound.

As described above, a charge transport layer 140 comprising plasma polymer is formed.

(Charge Transport Layer)

Then, the charge transport layer 140 according to the first embodiment is to be described with reference to FIG. 2 and FIG. 3. The charge transport layer 140 comprising the plasma polymer formed by the polymerization step described above has the following feature.

Figure 2:
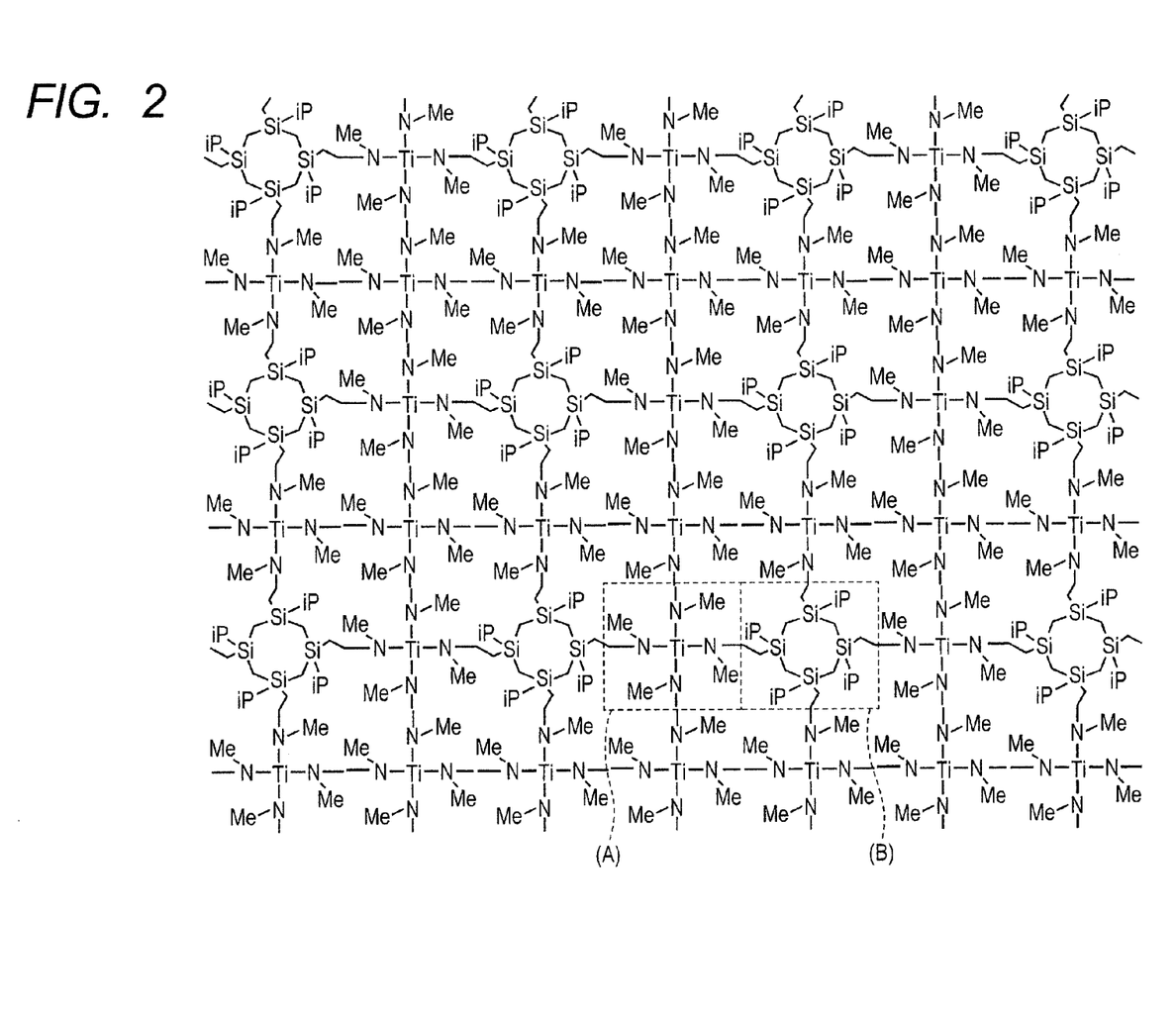
FIG. 2 is a schematic view showing the structure of a plasma polymer according to the first embodiment.
Figure 3:
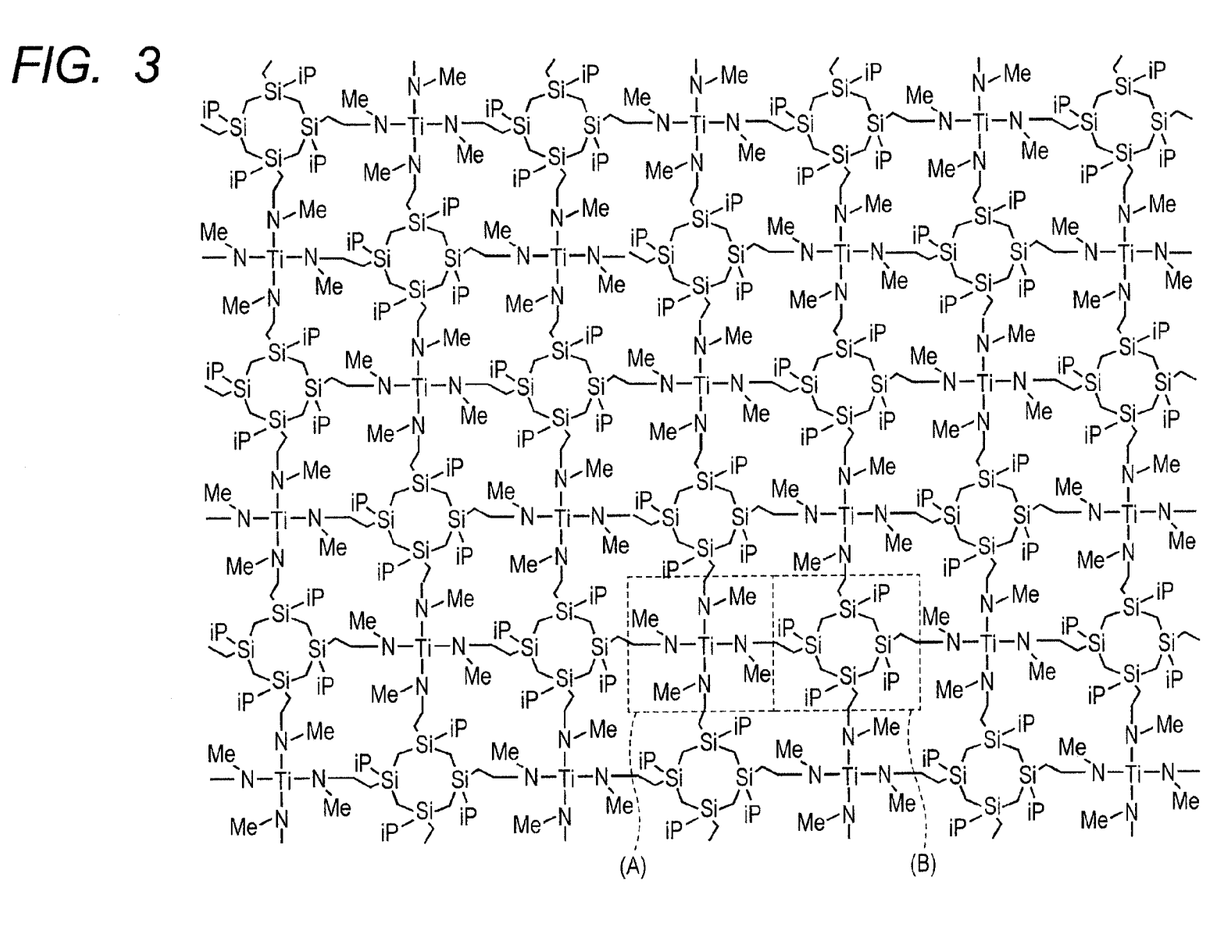
FIG. 3 is a schematic view showing the structure of another plasma polymer according to the first embodiment.

FIG. 2 and FIG. 3 are schematic views showing the structure of the plasma polymer according to the first embodiment. Hereinafter, "Me" represents a methyl group and "iP" represents an isopropyl group in FIG. 2 and FIG. 3.

FIG. 2 and FIG. 3 to be described later show examples of the plasma polymer according to the first embodiment but they are not restricted to the illustrated forms. Further, it is not always necessary that the entire charge transport layer 140 comprises the forms illustrated in FIG. 2 and FIG. 3. That is, the forms illustrated in FIG. 2 and FIG. 3 may be a portion of the charge transport layer 140. Alternatively, the charge transport layer 140 may comprise a mixture of forms shown in FIG. 2 and FIG. 3 present together.

At first, FIG. 2 shows a case of using tetrakisdimethylamino titanium having Ti for the transition metal in the chemical formula (2) as the organic metal compound and tetravinyl tetrapropyl cyclotetrasiloxane represented by the chemical formula (9) as the cyclosiloxane compound. In the case of FIG. 2, the feeding ratio between the organic metal compound and the cyclosiloxane compound is 3:1.

As shown in FIG. 2, the plasma polymer of this embodiment contains the structural unit (A) having the transition metal as the central metal, and the structural unit (B) situated between the structural units (A) adjacent to each other and having a cyclosiloxane skeleton.

The structural unit (B) contains a cyclosiloxane compound used as the starting material. That is, the structural unit (B) contains a portion of the cyclosiloxane compound of the chemical formula (1). The state where the structure unit B "contains a portion of the compound" means a state in which a portion of the compound is incorporated while remaining as it is into the thin film of the plasma polymer. Alternatively, the state where the structural unit "contains a portion of the compound" includes a state in which some chemical bonds of the starting material compound are bonded with other compound by plasma polymerization of the compound by the polymerization step.

The cyclosiloxane compound contained in the structural unit (B) can be a cyclosiloxane compound represented by the chemical formula (5) or (6). In the case of FIG. 2, a portion of the cyclosiloxane compounds represented by the chemical formula (8) in the chemical formula (5) is contained.

Further, for the structural unit (B), it may suffice, for example, that at least a cyclosiloxane skeleton remains. Further, in the cyclosiloxane compound, it is preferred that the double bond of the ethylene group is bonded with one of the ligands of the structural unit (A).

In FIG. 2, ethylene groups on four side chains are bonded respectively to the structural units (A). However, ethylene groups may partially remain in the plasma polymer.

Among the side chains of the cyclosiloxane compound, any one of the side chains may be detached by plasma polymerization.

On the other hand, the structural unit (A) comprises an organic metal compound used as the starting material. That is, the structural unit (A) contains a portion of the organic metal compound having a transition metal. It may suffice that the structural unit (A) has at least the transition metal. In other words, it may suffice that at least the transition metal in the structure unit (A) remains as it is and is incorporated in the plasma polymer.

The organic metal compound contained in the structural unit (A) may be an organic metal compound represented by the chemical formula (2), (3), or (4). In FIG. 2, the structural unit (A) contains a portion of the organic metal compound shown by the chemical formula (2). The transition metal in the organic metal compound may be Ti as shown in FIG. 2 and, in addition, may be Hf or Zr. M may also be other metal such as Sn.

Further, a portion of the organic metal compound in the structural unit (A) is preferably in covalent bond with the structural unit (B). As described above, the organic metal compound has a structure, for example, shown by the chemical formula (2), (3) or (4). In FIG. 2, since the organic metal compound has the chemical formula (2), the C—H bond, for example, of the methyl group at the terminal end is disconnected in the structural unit (A) and bonded to a portion of the structural unit (B) where the ethylene group was present.

The structural units (A) and the structural units (B) may be bonded two-dimensionally or three dimensionally. Further, each of the structural units may be bonded to different portions respectively. In addition to the bonding described above, some portion forming dangling bonds may also be present.

FIG. 3 is a modified example of FIG. 2. In FIG. 3, the feeding ratio between the organic metal compound and the cyclosiloxane compound is 1:1.

It is not necessary that the structural units (A) and the structural units (B) are orderly bonded alternately as shown in FIG. 2. There may be a portion where the structural unit (A) and the structural unit (A) are bonded as in FIG. 3. Further, although it is not illustrated, there may be also a portion where the structural unit (B) and the structural unit (B) are bonded.

The ratio between the structural unit (A) and the structural unit (B) is determined while considering the compounds to be used, the type of the semiconductor device 10 to which the plasma polymer is applied, the desired carrier concentration, etc. When it is intended to increase the electroconductivity, the ratio of the structural unit (A) containing the transition metal may be increased. On the other hand, when it is intended to increase the semiconductivity or the resistivity, the ratio of the structural unit (B) may be increased.

Figure 4A:
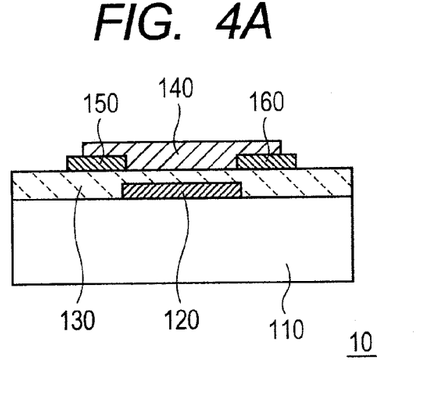
FIG. 4A is a cross sectional view showing a bottom gate type FET of a semiconductor device according to the first embodiment.
Figure 4B:
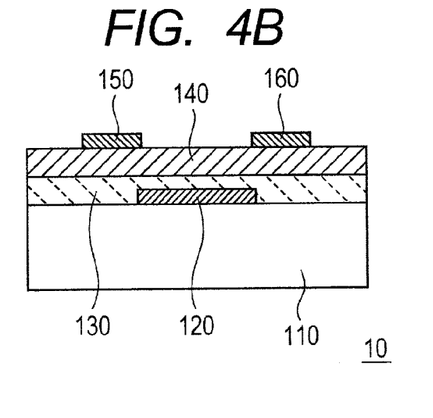
FIG. 4B a cross sectional view showing a modified bottom gate type FET of a semiconductor device according to the first embodiment.
Figure 4C:
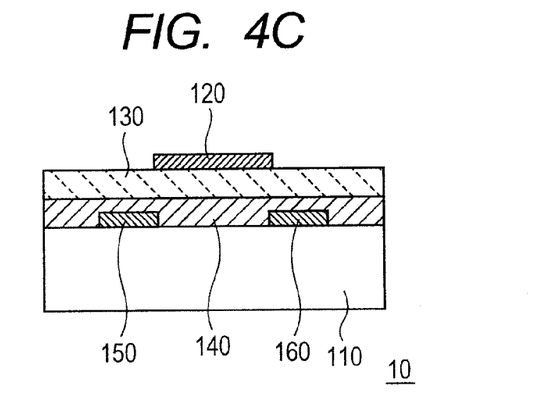
FIG. 4C a cross sectional view showing a top gate type FET of a semiconductor device according to the first embodiment.

Then, a semiconductor device 10 using the charge transport layer (140) comprising the plasma polymer described above is to be described with reference FIGS. 4A to 4C. Each of FIGS. 4A to 4C is a cross sectional view showing the configuration of a semiconductor device 10 according to the first embodiment. The semiconductor device 10 has a source electrode 150 and a drain electrode 160 disposed so as to be in contact with the charge transport layer 140, a channel region (reference numeral is not illustrated) put between the source electrode 150 and the drain electrode 160 in the charge transport layer 140, a gate insulative layer 130 disposed so as to be in contact with the channel region, and a gate electrode 120 disposed so as to be in contact with the gate insulative layer 130. Details are to be described.

FIG. 4A shows a so-called bottom gate type FET (Field Effect Transistor). As shown in FIGS. 4A to 4C, a gate electrode 120 is formed over an insulative substrate 110.

The insulative substrate 110 is not restrictive so long as it has insulating property. Specifically, the insulative substrate 110 is a silicon substrate having a thermal oxide film. When a polymerization step can be conducted at a low temperature, it may be a glass or plastic film.

A gate insulative layer 130 is formed over the gate electrode 120 so as to cover the gate electrode 120. Further, the source electrode 150 and the drain electrode 160 are formed over the gate insulative layer 130 so as to put the gate electrode 120 therebetween in a plan view.

The material for the gate electrode 120, the source electrode 150, and the drain electrode 160 include, for example, Cu, Al, and Au. Further, the material is used, for example, as a barrier metal for the interconnect, which may be Ti, TiN, Ta, TaN, Ru, or Mn.

Further, the charge transport layer 140 is formed over the gate insulative layer 130, the source electrode 150, and the drain electrode 160. The charge transport layer 140 is formed of the plasma polymer by the polymerization step described above.

The charge transport layer 140 has the structural unit (A) having the transition metal together with the structural unit (B) having the cyclosiloxane skeleton. Accordingly, the structural unit (A) functions as a donor for donating electrons in the charge transport layer 140. The structural unit (A) also functions as a hopping site upon hopping conduction of electrons between the source electrode 150 and the drain electrode 160. Accordingly, in the charge transport layer 140, a portion put between the source electrode 150 and the drain electrode 160 functions as a channel region of FET.

As has been described above, the semiconductor device 10 having the charge transport layer 140 comprising the plasma polymer described above functions as an FET.

FIG. 4B is a modified example of the bottom gate type FET as shown in FIG. 4A. As shown in FIG. 4B, a source electrode 150 and a drain electrode 160 may be formed over the charge transport layer 140. Other configurations are identical with those in FIG. 4A.

Further, it may also be a top gate type FET as shown in FIG. 4C. A source electrode 150 and a drain electrode 160 is formed over an insulative substrate 110. A charge transport layer 140 is formed over the insulative substrate 110, the source electrode 150, and the drain electrode 160.

A gate insulative layer 130 is formed over the charge transport layer 140. Further, the gate electrode 120 is disposed over a channel region (reference numeral is not shown) put between the source electrode 150 and the drain electrode 160 in a plan view and disposed so as to be in contact over the gate insulative layer 130.

Also the semiconductor device 10 in FIG. 4B and FIG. 4C can function as an FET in the same manner as the semiconductor device 10 in FIG. 4A.

Then, the effect of the first embodiment is to be described.

According to the first embodiment, the charge transport layer 140 is formed of a plasma polymer containing a structural unit (A) having a transition metal as a central metal and a structural unit (B) having a cyclosiloxane skeleton. Thus, in the charge transport layer 140, the structural unit (A) having the transition metal functions as a donor or a hopping site. Accordingly, it is possible to provide a semiconductor device 10 containing novel cyclosiloxane polymer showing electroconductivity or semiconductivity.

Second Embodiment

Figure 5:
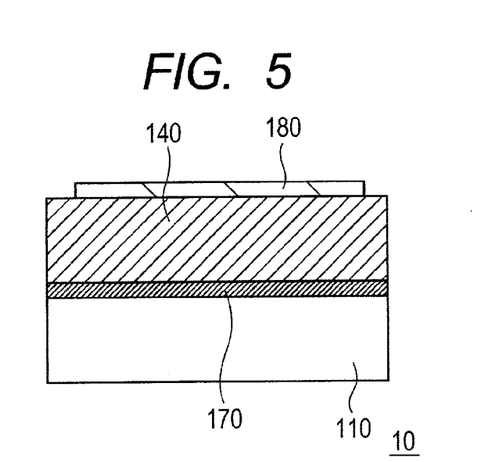
FIG. 5 is a cross sectional view showing the configuration of a semiconductor device according to the second embodiment.

FIG. 5 is a view showing the configuration of a semiconductor device 10 according to a second embodiment. The second embodiment is identical with the first embodiment except that the semiconductor device 10 is a photoreceiving device. This is to be described specifically.

As shown in FIG. 5, the semiconductor device 10 has the following configuration. A lower electrode 170 is formed over an insulative substrate 110. For the insulative substrate 110, the same substrate as in the first embodiment can be used.

The material for the lower electrode 170 includes, for example, Cu, Al, and Au. Further, the material may also be Ti, TiN, Ta, TaN, Ru, or Mn used, for example, as a barrier metal for interconnects.

A charge transport layer 140 is disposed over the lower electrode 170. In the same manner as in the first embodiment, the charge transport layer 140 comprises a plasma polymer. Thus, the charge transport layer 140 can function as a photoelectric conversion layer.

A transparent electrode 180 is formed over the charge transport layer 140. The material for the transparent electrode 180 includes, for example, ITO (Indium Tin Oxide).

According to the second embodiment, the charge transport layer 140 comprising the plasma polymer described above is disposed as a photoelectric conversion layer. In the plasma polymer, electrons are trapped to a portion of the structural units (A). By the light irradiation to the semiconductor device 10, electrons trapped in the structural unit (A) are excited. Thus, the resistance value of the charge transport layer 140 is decreased. Accordingly, the semiconductor device 10 can function as a photoreceiving device in which the resistance value changes by light irradiation.

When the insulative substrate 110 is a light transmitting substrate such as a glass substrate, it may be formed in the order of the transparent electrodes 180, the charge transport layer 140, and an upper electrode (not illustrated).

Example

Then, examples are to be described.

For forming the bottom gate type FET as shown in FIG. 4A, the insulative substrate 110 having the gate electrode 120, the gate insulative layer 130, the source electrode 150, and the drain electrode 160 formed therein was prepared. As the insulative substrate 110, a p-type silicon substrate having the thermal oxide film was used.

Then, the charge transport layer 140 was formed over the gate insulative layer 130, the source electrode 150, and the drain electrode 160 using the manufacturing apparatus 20 by the following methods, to form the charge transport layer 140.

The insulative substrate 110 described above was placed on the stage 203. By heating the stage 203, the surface temperature of the insulative substrate 110 was controlled, for example, to 300° C.

Then, as the starting material for the organic metal compound, tetrakisdimethylamino titanium represented by the chemical formula (2) having Ti as a transition metal M was used. Further, as the starting material for the cyclosiloxane compound, tetravinyltetrapropyl cyclotetrasiloxane represented by the chemical formula (8) was used. The respective starting materials were sealed in the starting material reservoir tank 226a and the starting material reservoir tank 226b.

As a carrier gas used for the organic metal compound, He was introduced at 300 sccm by way of a gas flow rate controller 218a into the evaporator 216a. Further, as the carrier gas for the cyclosiloxane compound, He was introduced at 100 sccm by way of the gas flow rate controller 218b to the evaporator 216b. Thus, gases were introduced at a total flow rate of 400 sccm by way of the pipeline 215 into the reactor 201.

In the polymerization step, the pressure in the reactor 201 was controlled to 3 Torr. Further, a high frequency wave at 100 W power was applied. Thus, a charge transport layer 140 of 100 nm thickness was formed.

The charge transport layer 140 formed by the steps described above was put to compositional analysis. EDX (Energy Dispersive X-ray Spectroscopy) analysis and FT-IR (Fourier Transform-Infrared Spectroscopy) analysis were performed for the compositional analysis.

According to the EDX analysis, it was found that a thin film containing Ti, Si, O, C, and N was formed as the charge transport layer 140. The Ti:Si ratio was about 3:4. Accordingly, it was found that a thin film about at a same compositional ratio as the ratio of the supplied starting materials was formed. Further, since the thin film contained N, it was found that the organic metal compound was incorporated in a state having at least Ti—N bonds.

Further, according to the FT-IR analysis, it was found that absorption at 1465 $cm^{-1}$ attributable to the isopropyl group is present in the thin film of the charge transport layer 140. The isopropyl group is derived from the cyclosiloxane compound. Accordingly, it was found that the isopropyl group was incorporated into the thin film not being detached from the cyclosiloxane skeleton in the polymerization step.

In view of the result described above, it is considered that the charge transport layer 140 of the example forms the plasma polymer shown in FIG. 3.

Further, as a result of driving the semiconductor device 10 of the example, it showed a depression type FET characteristic. As described above, the semiconductor device 10 containing the novel cyclosiloxane polymer could be manufactured.

In the embodiments described above, description has been made to a case where the structural unit (A) has the transition metal as the central metal. On the other hand, the structural unit (A) of the invention may also have Sn which is a metal other than the transition metal as the central metal. Accordingly, the following configurations can also be applied to the semiconductor device, the manufacturing method of the semiconductor device, and the thin film. (1) A semiconductor device having a charge transport layer comprising a plasma polymer containing structural units (A) each having Sn as a central metal, and structural units (B) each situated between the structural units (A) adjacent to each other and having a cyclosiloxane skeleton. (2) A method of manufacturing a semiconductor device including a polymerization step of forming a charge transport layer by plasma polymerization of an organic metal compound having Sn as a central metal and a cyclosiloxane compound in a reactor. (3) A thin film comprising a plasma polymer containing structural units (A) each having Sn as a central metal and a structural units (B) each situated between structural units (A) adjacent to each other and having a cyclosiloxane skeleton. The same configuration or the method as that in the embodiment described above can be applied also in the cases of (1) to (3). Also in these cases, the same effect as that in the embodiment described above can be obtained.

The present invention has been described in view of the embodiments with reference to the drawings but they are only the illustration of the present invention and other configurations than those described above can also be adopted.

What is claimed is:

1. A semiconductor device having a charge transport layer comprising a plasma polymer containing
   structural units (A) each having a transition metal as a central metal and
   structural units (B) each situated between the structural units (A) adjacent to each other and having a cyclosiloxane skeleton.

2. A semiconductor device according to claim 1, wherein the structural unit (B) contains a portion of a cyclosiloxane compound of the following chemical formula (1):

(1)

(in which, in the chemical formula (1), n is from 2 to 5, each of $R_x$ and $R_y$, represents hydrogen, an unsaturated hydrocarbon group or a saturated hydrocarbon group, each of the unsaturated hydrocarbon group and the saturated hydrocarbon group is a vinyl group, allyl group, methyl group, ethyl group, propyl group, isopropyl group, butyl group, or tertiary butyl group).

3. A semiconductor device according to claim 2, wherein n is 3 or 4 in the structural unit (B).

4. A semiconductor device according to claim 1, wherein the structural unit (A) contains a portion of an organic metal compound having a transition metal.

5. A semiconductor device according to claim 4, wherein the organic metal compound has a structure shown in the following chemical formula (2), (3), or (4):

(2)

(3)

(4)

(in which in the chemical formula (2), (3) or (4), M represents a transition metal).

6. A semiconductor device according to claim 1, wherein the transition metal is Ti, Hf, or Zr.

7. A semiconductor device according to claim 1, wherein the semiconductor device comprises a source electrode and a drain electrode disposed so as to be in contact with the charge transport layer,
a channel region in the charge transport layer put between the source electrode and drain electrode,
a gate insulative layer disposed so as to be in contact with the channel region, and
a gate electrode disposed so as to be in contact with the gate insulative layer.

8. A method of manufacturing a semiconductor device including
a polymerization process of forming a charge transport layer by plasma polymerization of
an organic metal compound having a transition metal as a central metal, and
a cyclosiloxane compound in a reactor,
wherein the method forms a plasma polymer containing structural units (A) each having a transition metal as a central metal and structural units (B) each situated between the structural units (A) adjacent to each other and having a cyclosiloxane skeleton.

9. A method of manufacturing a semiconductor device according to claim 8, wherein
the charge transport layer is a plasma polymer containing the structural units (A) each comprising an organic metal compound, and
the structural units (B) each situated between the structural units (A) adjacent to each other and comprising the cyclosiloxane compound.

10. A method of manufacturing a semiconductor device according to claim 8, wherein
the cyclosiloxane compound is polymerized with the organic metal compound in the polymerization process by activating at least the cyclosiloxane compound into a plasma state.

11. A method of manufacturing a semiconductor device according to claim 8, wherein
the cyclosiloxane compound has a structure of the following chemical formula (1)

(1)

(in which, in the chemical formula (1), n is from 2 to 5, each of $R_x$ and $R_y$ represents hydrogen, an unsaturated hydrocarbon group or a saturated hydrocarbon group, Each of the unsaturated hydrocarbon group and the saturated hydrocarbon group is a vinyl group, allyl group, methyl group, ethyl group, propyl group, isopropyl group, butyl group, or tertiary butyl group).

12. A method of manufacturing a semiconductor device according to claim 8, wherein
n is 3 or 4 in the cyclosiloxane compound.

13. A method of manufacturing a semiconductor device according to claim 8, wherein
the cyclosiloxane compound has ethylene groups on the side chains.

14. A method of manufacturing a semiconductor device according to claim 8, wherein
the cyclosiloxane compound has a structure of the following chemical formula (5) or (6)

(5)

(6)

(in which, in the chemical formula (5) or (6), R1, R2, R3, and R4 each represents one of hydrogen, an unsaturated hydrocarbon group, and saturated hydrocarbon group, and each of the unsaturated hydrocarbon group and the saturated hydrocarbon group is a vinyl group, allyl group, methyl group, ethyl group, propyl group, isopropyl group, or butyl group).

15. A method of manufacturing a semiconductor device according to claim 13, wherein
the cyclosiloxane compound is polymerized with the organic metal compound by radicalizing the ethylene group of the cyclosiloxane compound.

16. A method of manufacturing a semiconductor device according to claim 8, wherein
the organic metal compound has a structure shown by the following chemical formula (2), (3), or (4)

(2)

(3)

(4)

(in which in the chemical formula (2), (3) or (4), M represents a transition metal).

17. A method of manufacturing a semiconductor device according to claim 8, wherein
the transition metal is Ti, Hf, or Zr.

18. A method of manufacturing a semiconductor device according to claim 8, wherein
the method includes:
forming a source electrode and a drain electrode so as to be in contact with the charge transport layer,
forming a gate insulating layer so as to be in contact with a channel region in the charge transport layer put between the source electrode and the drain electrode, and
forming a gate electrode so as to be in contact with the gate insulative layer.

19. A thin film comprising a plasma polymer containing
structural units (A) each having a transition metal as a central metal and
structural units (B) each situated between structural units (A) adjacent to each other and having a cyclosiloxane skeleton.

* * * * *